United States Patent
Zhang et al.

(10) Patent No.: US 8,632,720 B2
(45) Date of Patent: Jan. 21, 2014

(54) METHODS AND APPARATUS FOR RAPID IMPRINT LITHOGRAPHY

(75) Inventors: Wei Zhang, Netown, PA (US); Hua Tan, Princeton Junction, NJ (US); Stephen Y. Chou, Princeton, NJ (US)

(73) Assignee: Nanonex Corporation, Monmouth Junction, NJ (US)

( * ) Notice: Subject to any disclaimer, the term of this patent is extended or adjusted under 35 U.S.C. 154(b) by 618 days.

(21) Appl. No.: 12/794,971

(22) Filed: Jun. 7, 2010

(65) Prior Publication Data
US 2010/0244324 A1     Sep. 30, 2010

Related U.S. Application Data

(60) Continuation of application No. 11/943,977, filed on Nov. 21, 2007, now abandoned, and a continuation-in-part of application No. 11/931,280, filed on Oct. 31, 2007, and a continuation-in-part of application No. 10/926,376, filed on Aug. 25, 2004, now Pat. No. 7,322,287, which is a continuation-in-part of application No. 10/140,140, filed on May 7, 2002, now Pat. No. 7,137,803, which is a division of application No. 09/618,174, filed on Jul. 18, 2000, now Pat. No. 6,482,742.

(60) Provisional application No. 60/867,515, filed on Nov. 28, 2006, provisional application No. 60/916,080, filed on May 4, 2007.

(51) Int. Cl.
*B29C 33/46*     (2006.01)
*B29C 37/00*     (2006.01)

(52) U.S. Cl.
USPC .......................................................... 264/335

(58) Field of Classification Search
CPC ............................. B29C 33/46; B29C 37/0053
USPC ........................................................... 264/355
See application file for complete search history.

(56) References Cited

U.S. PATENT DOCUMENTS

2002/0115002 A1 *   8/2002   Bailey et al. ....................... 430/5

FOREIGN PATENT DOCUMENTS

WO        WO 03090985 A1 *  11/2003

* cited by examiner

*Primary Examiner* — Yogendra Gupta
*Assistant Examiner* — Alison Hindenlang
(74) *Attorney, Agent, or Firm* — Polster, Lieder, Woodruff & Lucchesi, LC

(57) ABSTRACT

A mold for imprinting a patterned region by imprint lithography is provided with a peripheral groove around the patterned region. The groove is connected, as by channels through the mold, to a switchable source for gas removal to prevent bubbles and for the application of pressurized gas to separate the mold and substrate. In use, the mold is disposed adjacent the moldable surface and gas is withdrawn from the patterned region through the groove as the mold is pressed toward and into the moldable surface. At or near the end of the imprinting, the process is switched from removal of gas to the application of pressurized gas. The pressurized gas passes through the groove and separates or facilitates separation of the mold and the moldable surface.

20 Claims, 6 Drawing Sheets

METHODS AND APPARATUS FOR RAPID IMPRINT LITHOGRAPHY

CROSS-REFERENCE TO RELATED APPLICATIONS

The present application is a continuation of U.S. patent application Ser. No. 11/943,977 to Zhang filed on Nov. 21, 2007, from which priority is claimed. The '977 Zhang application claims the benefit of U.S. Provisional Application Ser. No. 60/867,515 to Zhang filed on Nov. 28, 2006. Each of the '977 and '515 applications is herein incorporated by reference.

The present application is further a continuation-in-part of U.S. patent application Ser. No. 11/931,280 to Tan et al. filed on Oct. 31, 2007, from which priority is claimed. The '280 Tan et al. application claims the benefit of U.S. Provisional Application Ser. No. 60/916,080 to Tan et. al. filed on May 4, 2007. The '280 Tan et al. application is further a continuation-in-part of U.S. patent application Ser. No. 10/926,376 to Tan et al. filed on Aug. 25, 2004 (now U.S. Pat. No. 7,322,287 B2) which, in turn, is a continuation-in-part of U.S. patent application Ser. No. 10/140,140 to Chou filed on May 7, 2002 (now U.S. Pat. No. 7,137,803 B2). The '140 Chou application is a divisional of U.S. patent application Ser. No. 09/618,174 to Chou filed on Jul. 18, 2000 (now U.S. Pat. No. 6,482,742 B1). Each of the '280, '080, '376, '140, and '174 applications is herein incorporated by reference.

FIELD OF THE INVENTION

This invention relates to methods and apparatus for performing imprint lithography. It is particularly useful for providing high resolution microscale or nanoscale imprint lithography at high speed.

BACKGROUND OF THE INVENTION

Lithography is a key process in the fabrication of semiconductor integrated circuits and many optical, magnetic, biological and micromechanical devices. Lithography creates a pattern on a thin film carried on a substrate so that, in subsequent process steps, the pattern can be replicated in the substrate or in another material that is added onto the substrate.

Conventional lithography, referred to as photolithography, involves applying a thin film of photosensitive resist to a substrate, exposing the resist to a desired pattern of radiation and developing the exposed resist to produce a physical pattern on the substrate. Unfortunately, the resolution of patterns produced by photolithography is limited by the wavelength of the exposing radiation. Moreover, as pattern features become smaller, increasingly expensive shorter wavelength equipment is required.

Imprint lithography, based on a fundamentally different principle, offers high resolution, high throughput, low cost and the potential of large area coverage. In imprint lithography, a mold with a pattern of projecting and recessed features is pressed into a substrate-supported moldable surface such as a thin film of polymer, deforming the shape of the film to form a relief pattern in the film. After the mold is removed, the thin film can be processed, as by removing reduced thickness portions of the film. Such removal exposes the underlying substrate for further processing such as etching, doping, or deposition. Imprint lithography can be used to replicate patterns having high resolution features in the microscale and nanoscale ranges. Details of nanoscale imprint lithography ("nanoimprint lithography") are described, for example, in U.S. Pat. No. 5,772,905 issued Jun. 30, 1998 and entitled "Nanoimprint Lithography". The '905 patent is incorporated herein by reference.

A potential limitation on the rate of high speed manufacturing using imprint lithography is the presence of gas between the mold and the moldable film. Pressing the mold too rapidly can entrap gas bubbles in tiny recessed regions, deteriorating the resolution of the imprinted pattern. A second limitation is the separation of the mold and the imprinted substrate. Typically, after pressing, the mold and substrate are mechanically separated from the edge by inserting a wedge between the mold and substrate. This separation from the edge usually requires that the mold and substrate be transported from the site of the pressing apparatus to the site of the separation apparatus. The separation step thus limits throughput of imprinting. Furthermore, this conventional separation may cause cracking at the edge of the mold or substrate. It thus, contributes to mold wear, increases operating cost, and limits throughput.

Accordingly, it would be highly desirable to provide methods and apparatus to permit more rapid pressing and separation in imprint lithography.

BRIEF SUMMARY OF THE INVENTION

In accordance with the invention, a mold for imprinting a patterned region by imprint lithography is provided with a peripheral groove substantially around the patterned region. The groove is connected, as by channels through the mold, to a switchable fluid source for the application of pressurized fluid to separate the mold and substrate. Advantageously, the same grooves and channels may be used for gas removal to prevent bubbles.

In preferred use, the mold is disposed adjacent the moldable surface and gas is withdrawn from the patterned region through the groove and the channels as the mold is pressed toward and into the moldable surface. After the mold contacts the moldable surface, gas removal is either continued or stopped. At or near the end of the imprinting, the process is switched from removal of gas to the application of pressurized fluid such as gas. The pressurized fluid passes through the channels and the groove, and it separates or facilitates separation of the mold and the moldable surface.

BRIEF DESCRIPTION OF THE SEVERAL VIEWS OF THE DRAWINGS

The advantages, nature and various additional features of the invention will appear more fully upon consideration of the illustrative embodiments now to be described in detail in connection with the accompanying drawings. In the drawings.

It is to be understood that the drawings are for purposes of illustrating the concepts of the invention and are not to scale.

DETAILED DESCRIPTION

Figure 1:
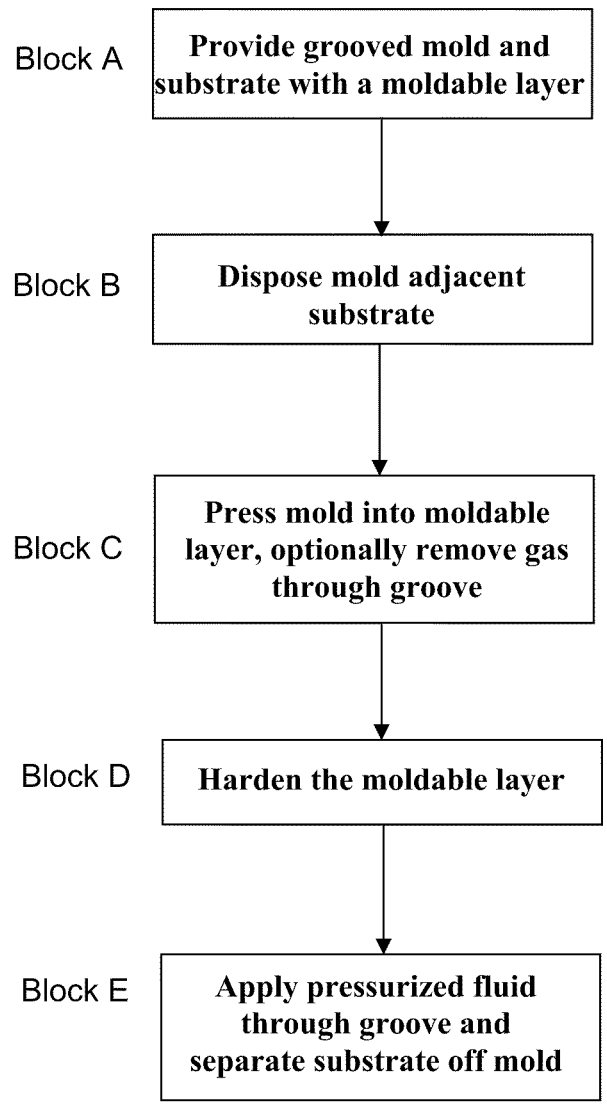
FIG. 1 is a flow diagram of the steps involved in imprinting a pattern in accordance with the invention.

Referring to the drawings, FIG. 1 is a flow diagram of the steps involved in imprinting a pattern in accordance with the invention. The first step shown in block A is to provide a substrate having a moldable surface and a grooved mold having a patterned region of projecting and recessed features for imprinting a desired pattern.

The substrate having a moldable surface typically comprises a substrate coated with a thin moldable layer such as a polymer resist. The substrate can be any one of a wide variety of materials such as semiconductors, polymers, dielectrics, and conductors. The moldable layers can be coatings of polymers or layers of powdered materials. A particularly advantageous coated substrate is crystalline silicon or silicon dioxide coated with a thermal or UV curable polymer. Exemplary combinations of substrate and resist are set forth in the aforementioned '905 patent incorporated herein by reference.

Figure 2:
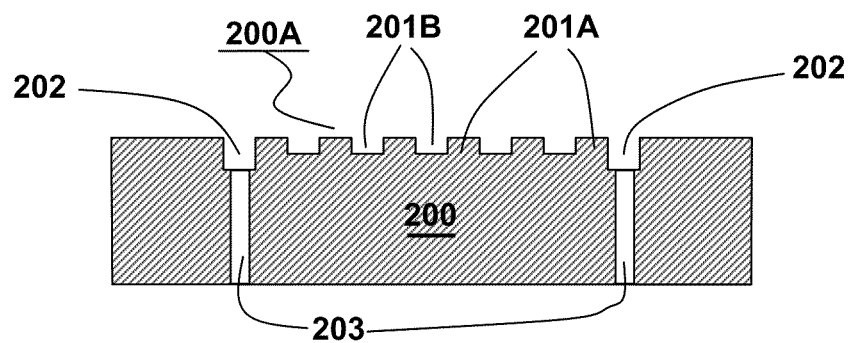
FIGS. 2 and 3 are schematic cross sectional and elevational views of a mold useful in the process of FIG. 1.
Figure 3:
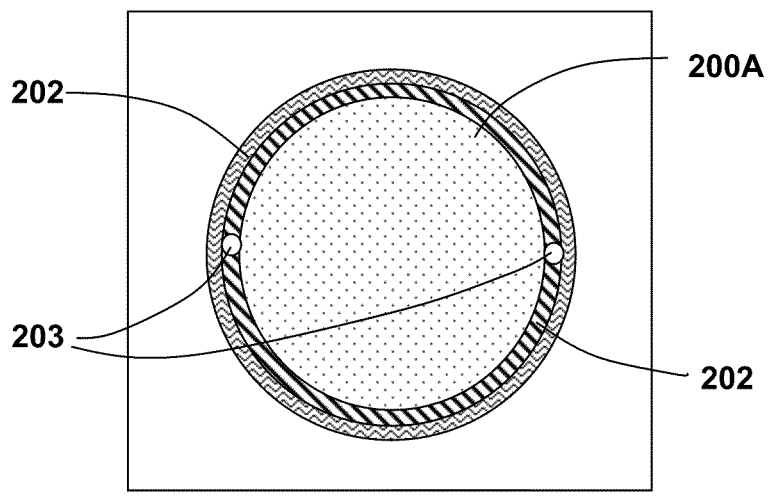

An exemplary grooved mold is schematically illustrated in FIG. 2 (cross sectional view) and FIG. 3 (elevational view). Referring to FIG. 2, the mold 200 typically comprises a substantially planar surface that includes at least one pattern region 200A to replicate a pattern by imprinting. The pattern region is composed of projecting features 201A and recessed feature 201B that, upon pressing into a moldable surface, imprint a pattern that has recessed features corresponding to mold projecting features 201A and projecting features that correspond to mold recessed features 201B. In highly advantageous applications, the mold has a pattern of projecting and recessed features for imprinting at least one feature having a minimum lateral dimension of less than 200 nanometers.

The mold surface is provided with a grooved trench 202 on the mold surface that includes pattern region 200A. The groove 202 is adjacent the pattern region 200A and preferably substantially surrounds the pattern region. The groove 202 is in physical communication with one or more through-holes 203 in the mold so that fluid (e.g. gas) can be pumped from the groove 202 via the through-hole(s) 203 from the mold/substrate interface. Alternatively, the through-holes could be replaced by additional surface channels to edges of the mold or in-body channels to sidewalls of the mold (not shown). Such pumping minimizes entrapped gas and facilitates molding. In addition fluid can be pumped into the groove 202 after or near the end of imprinting to facilitate release of the mold from the substrate. The fluid can be gas or liquid. Typically it is air or inert gas.

The shape of the groove 202 around the pattern region is advantageously in conformation with the outer periphery of the pattern region 200A so that the groove 202 is closely adjacent the boundary of the pattern region. Preferably the minimum distance between the groove and the pattern boundary is about 0.5 millimeter to 2.0 millimeter. Typical groove shapes are circular, or polygonal (e.g. rectangular) to surround individual pattern regions. However the groove shape can be zigzag to partially surround each of a plurality of pattern regions. The depth of the groove 202 is preferably in the range from about 1.0 micrometer to about 2.0 millimeters, although groove depth can range from about 50 nanometers to about one centimeter depending on the thickness of the mold. The groove can have any of a wide variety of cross sectional shapes. Typical cross sections can be squares, rectangles, triangles, semi-circles and parallelograms. The through-holes can be any desired cross section, but circular cross sections are typical. The groove effective diameters are typically in the range from about 5 micrometers to about 10 millimeters. At least one through-hole connected to the groove is preferred. Multiple through-holes connected to the groove are even more preferable for even flow of gas or fluid.

The mold 200 is advantageously fabricated of quartz, fused silica, metal semiconductor, polymer or a combination of these materials. The mold body thickness should provide sufficient mechanical strength for molding after the grooved trench and through-holes are made. Typically, body thickness is about 2 millimeters or greater. The pattern region 200A can be made by any of a wide variety of techniques depending on minimum feature size. For patterns that include nanoscale minimum features, the pattern region can be made by electron beam lithography. The groove trench and through-holes can be made by conventional techniques including machining (mechanical, laser, ultrasonic or jet), lithographic patterning and etching (wet chemical or dry plasma) or a combination of these techniques. The mold can be a homogenous body or multilayer of various materials. Also, the mold can be made by bonding several bodies together.

Referring to Block B of FIG. 1, after the mold and substrate are provided, the next step is to dispose the mold adjacent the substrate.

Figure 4:
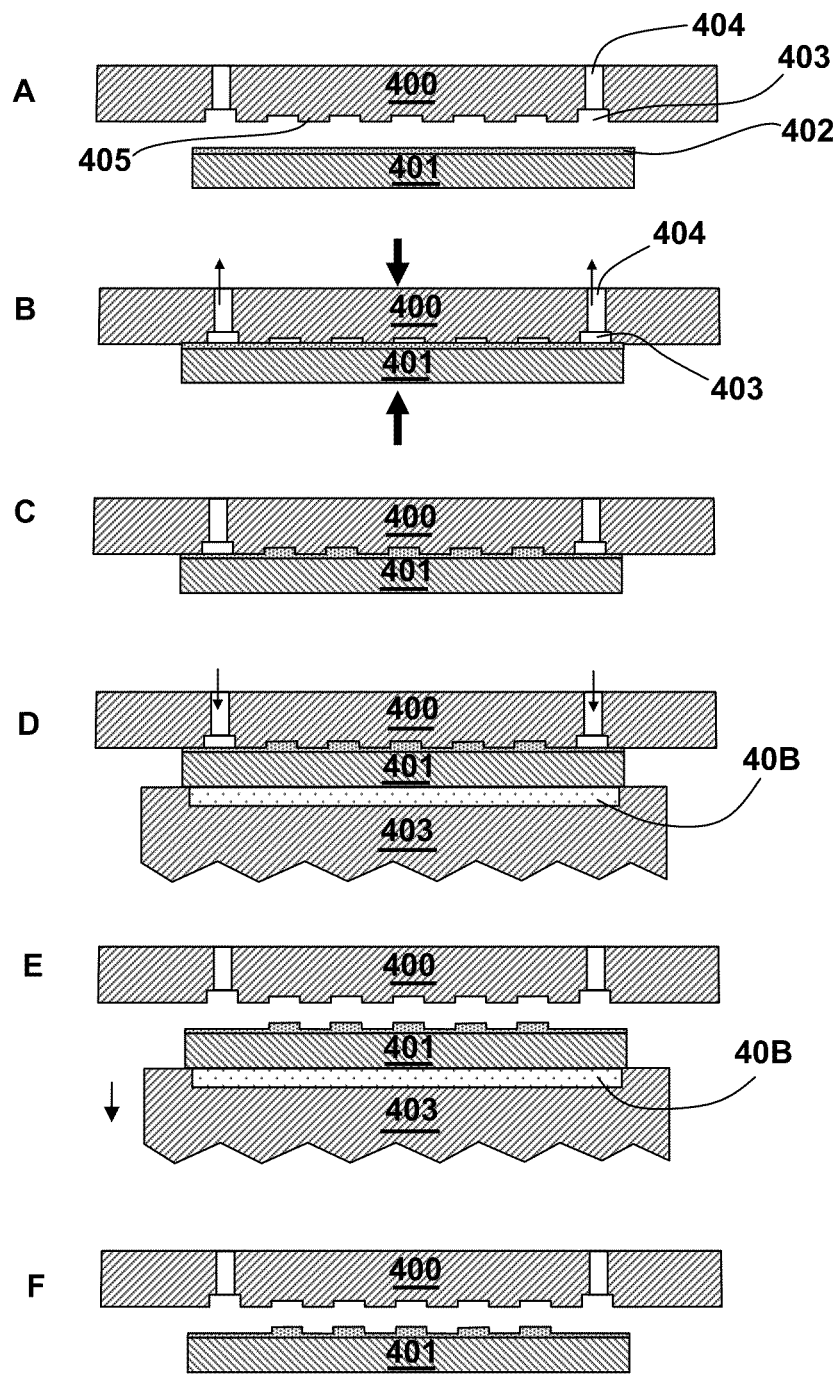
FIG. 4 schematically illustrates the molding apparatus at various stages of the process of FIG. 1.

FIG. 4A illustrates the mold 400 disposed adjacent the substrate 401 with the pattern 405 in position for imprinting the moldable surface 402. The mold is positioned so that the groove 403 is adjacent the moldable surface of substrate 401. The mold and substrate can be disposed in air or in a low pressure gas ambient.

The third step (referring to Block C of FIG. 1) is to press together the molding surface of the mold and the moldable surface of the substrate and, during at least a portion of the pressing, to remove gas through the groove and the through-holes.

FIG. 4B shows the mold 400 and substrate 401 pressed together with the pattern region of projecting and recessed features pressing against the moldable surface. The arrows pointing outward from through-holes 404 indicate gas removal from the mold/substrate interface through the groove 403 and the through-holes 404. While some gas will be passively removed by the reduction in volume as the mold and substrate are pressed together, it is preferred to actively pump gas out through the groove and through-holes. Active removal is effected by attaching the through-holes to a low-pressure reservoir (not shown) or a gas pump (not shown). Gas will flow from the region between the mold and the substrate to a lower pressure region connected to the through-holes.

Gas removal can be initiated prior to the start of the pressing step or after the start of pressing. The gas removal should begin early enough to remove gas between the pattern region and the moldable layer before the pattern region seals against the moldable layer.

The pressing can be affected in a variety of ways. One approach is to press the mold and the substrate together by a high precision mechanical press. For further details see U.S. Pat. No. 5,772,905.

Another approach is pressing by fluid pressure. The interface between the mold and the substrate is sealed from pressurized fluid, such as compressed air or inert gas that presses the mold and substrate together. For further details see U.S. Pat. No. 6,482,742, which is incorporated herein by reference. In this mode of pressing, the withdrawal of gas prior to pressing can not only assist in preventing bubbles but also can remove ambient gas diffused into interface region to increase the pressure difference between the interface region and the ambient. The withdrawal of gas creates a pressure difference between the interface region and the ambient. When the ambient pressure is increased, the pressure difference is increased sufficiently high to seal the interface. The withdrawal, thus, helps to seal the interface. Pressurized fluid can be introduced around the sealed mold/substrate assembly to imprint the patterned region into the moldable surface. The process can achieve sealing without using a flexible film to seal the interface, and, can be automatically sequenced for rapid manufacturing. Other approaches to pressing include pressing driven by the application of electrostatic or magnetic force.

The next step is to permit the moldable surface to harden sufficiently to retain the imprinted pattern (referring to Block D of FIG. 1). During the imprinting, the molding surface is sufficiently sealed against the moldable surface that no appreciable additional gas is withdrawn. This condition is illustrated in FIG. 4C. The moldable surface, typically resist, fully fills the space between the mold and the substrate. The resist is hardened, as by UV or thermal curing, or cooling a thermoplastic below its plastic transition temperature. The substrate and the mold may be held together by the hardened resist. The imprinting pressure can be removed before hardening or be maintained during hardening.

The fifth step (referring to Block E of FIG. 1) is to separate the mold from the substrate. This separation can be achieved or assisted by the application of pressurized fluid through the through-holes and the groove into the mold/substrate interface. The inwardly directed arrows in FIG. 4D represent pressurized fluid passing into the through-holes and the groove to the mold/substrate interface. The fluid here can be gas or liquid. The pressurized fluid first builds up at the groove region, and then at the interface region to separate the mold from the molded surface on the substrate.

The substrate and mold can then be moved apart. An advantageous optional enhancement of the separation step is to provide the substrate with a support having one or more vacuum attachment regions 40B. The evacuation of regions 40B through vacuum grooves (not shown) on body 403 can secure the substrate when the substrate is lifted off as shown in FIG. 4E. The injection of pressurized fluid into the interface and the application of vacuum to retain the substrate can be automatically sequenced. Thus each step in the imprinting process can be automatically controlled and sequenced for high speed manufacture. A mold that has a blank (smooth, flat) molding surface without surface replication features can be used to planarize a polymer layer to avoid unwanted surface variation of the substrate.

Figure 5:
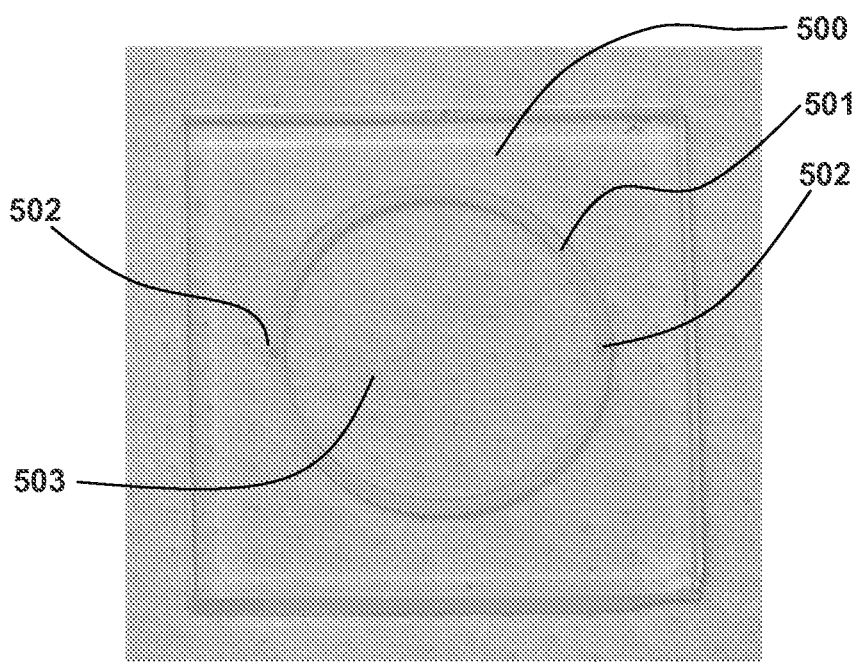
FIGS. 5, 6, and 7 depict apparatus and results of an experimental demonstration of the invention.

The invention may now be more clearly understood by consideration of the following experiment performed to demonstrate the workability of the method. FIG. 5 shows an enlarged view of the mold used for the experiment. The body 500 of the mold is approximately 1.5 inch×1.5 inch, 0.25 inch thick and is made of quartz. The mold includes a circular grooved trench 501 and two through-holes 502. The grooved trench has outer diameter of about 25 millimeters, a trench width of about 1 millimeter and a trench depth of about 1 millimeter. The two through-holes 502 directly connect to the grooved trench 501. The molding surface has surface replication features 503 in sizes ranging from several micrometers to several millimeters. The surface replication 2

Figure 6:
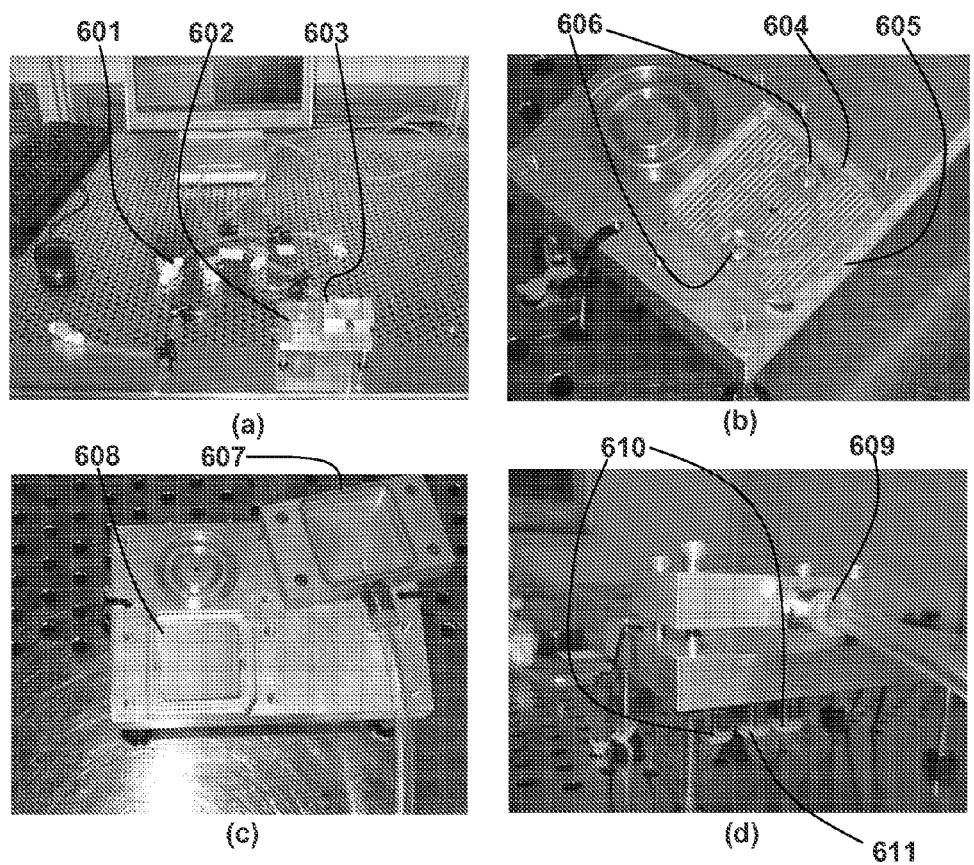

FIG. 6A is a photo showing the testing setup with which the experiment was performed. The testing setup consists of gas/vacuum control 601, a base plate 602, a top plate 603 and a user interface computer control panel (not shown). The computer control panel controls the supplies of gas and vacuum pumping. However, the process tested was controlled mainly by the manual valves 601.

FIG. 6B shows the mold 604 and bottom plate 605 of the testing setup. The vacuum grooves to hold the mold against the bottom plate can be seen through body of the mold. There are two holes 606 through the bottom plate surrounded by two circular grooves respectively. The two holes on the bottom plate are the two through-holes.

Referring to FIG. 6C, the substrate 608 used in the experiment was put on top of the mold with surface to be imprinted contacting with top surface of the mold. In a commercial embodiment, this placement could be done by a conventional positioner. A UV curable resist layer was coated on the surface of the substrate. The top plate with O-ring 607 is also shown at the right of the photo. When the top plate was installed on the top of the mold, the recessed area of the top plate formed a sealed chamber. The substrate was cut from a Silicon wafer to fit into the chamber and to cover the grooved trench of the mold.

FIG. 6D depicts the installed setup ready for testing. Connector 609 goes to the sealed chamber. Connectors 610 go to the through-holes of the bottom of the plate, then to the through-holes of the mold and finally to the grooved trench of the mold. Connector 611 goes to the vacuum grooves on the surface of the bottom plate that holds the mold against the bottom plate. Screws hold the sealed chamber for vacuuming and pressurizing.

The experimental process was as follows: (1) load the mold on the bottom plate and turn on the vacuum to hold the mold; (2) coat the UV curable layer on top of the substrate; (3) load the coated substrate on the mold; (4) install the top plate on top of the mold and clamp the sealed chamber with screws; (5) turn on vacuuming inside the chamber and vacuuming through the grooved trench; (6) turn off the vacuuming inside the chamber and maintain vacuuming through the grooved trench; (7) fill pressurized nitrogen into the chamber; (8) hold for a time period; (9) cure the UV curable layer by UV exposure through the transparent body of the mold; (10) release the pressure inside the chamber and take off the top plate. The vacuuming through the grooved trench could be turned off anytime after step 7; (11) flow pressurized nitrogen through the grooved trench; (12) separate the substrate from the mold by the blowing gas.

In ten runs the substrates were separated from the mold with the inlet pressure of blowing nitrogen set at or gradually increased to approximate 30 psi. The surface replication features enclosed by the grooved trench were replicated into the UV cured layer on all runs.

Figure 7:
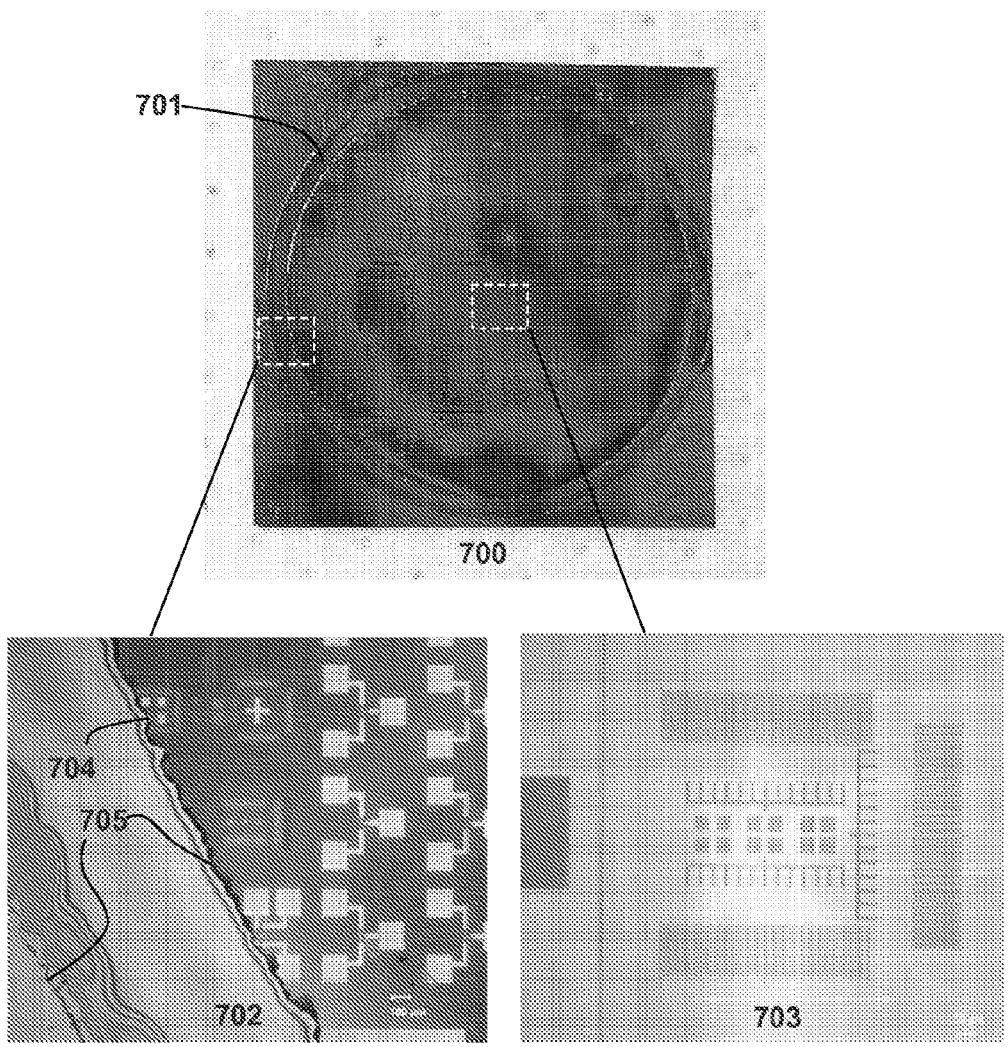

FIG. 7 shows a typical result of imprinting from the experiment. Image 700 is the substrate with the trace of the grooved trench 701 and surface patterns replicated from the mold. The trace of the grooved trench is a closed loop indicating a good seal for the imprint. The patterns were replicated uniformly although variation of colors around a particle on the substrate was seen. Image 702 shows imprinted patterns on the substrate near the edges of the grooved trench 704, 705. On the image, patterns with good imprinting quality were obtained right to the inner edge of the grooved trench 704. Image 703 shows the imprinted pattern close to the center of the substrate. The imprinting quality of the patterns is very good.

It can now be seen that one aspect of the invention is a method of imprinting a substrate having a moldable surface. It comprises providing the substrate and providing a mold having a molding surface for imprinting onto the moldable surface. The molding surface is substantially surrounded by a surface groove for conducting fluid. The mold is disposed adjacent the substrate with molding surface adjacent the moldable surface. The molding surface is pressed against the moldable surface to imprint the moldable surface. Prior to and/or during the pressing, gas is advantageously withdrawn through the surface groove. The moldable surface is hardened to retain the imprint, and pressurized fluid is then applied through the groove to facilitate separation of the mold from the imprinted moldable surface.

Another aspect of the invention is apparatus for imprinting a molding surface on a substrate having a moldable surface. The apparatus including, in operative relation, a mold having a molding surface that is substantially surrounded by a surface groove for conducting fluid. A positioner can be provided to dispose the mold adjacent the substrate with the molding surface adjacent the moldable surface.

The apparatus can include a pump or low-pressure gas reservoir switchably connected to withdraw gas through the surface groove. It includes a source of pressurized fluid switchably connected to apply pressurized fluid through the surface groove.

Apparatus is provided to press the mold against the substrate, and a controller is provided to direct the introduction of pressurized fluid to separate the mold and the substrate. The controller may advantageously also direct the withdrawal of gas before and/or during pressing.

It is to be understood that the above-described embodiments are illustrative of only a few of the many possible specific embodiments which can represent applications of the invention. Numerous and varied other arrangements can be made by those skilled in the art without departing from the spirit and scope of the invention.

The invention claimed is:

1. A method of imprint lithography comprising the steps of:
   providing a substrate having a moldable surface;
   providing a mold having a molding surface for imprinting onto the moldable surface, the mold comprising a continuous surface groove substantially surrounding the molding surface for conducting fluid and a void fluidly coupled to the continuous surface groove for conducting the fluid with the continuous surface groove;
   disposing the mold adjacent the substrate with the molding surface adjacent the moldable surface;
   pressing the molding surface against the moldable surface to imprint the moldable surface;
   after or during the pressing, hardening the moldable surface; and
   applying pressurized fluid through the continuous surface groove to facilitate separation of the mold from the imprinted moldable surface.

2. The method of claim 1 further comprising the step of withdrawing fluid from between the disposed molding surface and the adjacent moldable surface through the surface groove and the void prior to or during the pressing.

3. The method of claim 1 wherein the pressing comprises sealing the region between the molding surface and the moldable surface to produce a sealed mold/substrate assembly and subjecting the mold/substrate assembly to direct fluid pressure.

4. The method of claim 3 wherein the sealing comprises the step of withdrawing said fluid through the continuous surface groove.

5. The method of claim 1 wherein the pressing comprises pressing by a mechanical press.

6. The method of claim 1 further comprising a step of moving apart said substrate and said mold.

7. The method of claim 1 wherein said mold comprises a plurality of voids, each of said voids connecting said continuous surface groove at one end of said void and the surface opposite to said molding surface of the sidewall surface at the other end of said void.

8. The method of claim 1 wherein said continuous surface groove is made either by machining or by a lithographical patterning and etching.

9. The method of claim 1 wherein said mold comprises a plurality of bodies bonded together.

10. A method to imprint a molding surface of a mold onto a moldable surface of a substrate comprising the steps of:
    providing the mold having a molding portion enclosed by a closed loop surface groove on the molding surface and a void fluidly coupled to the closed loop surface groove for conducting the fluid with the closed loop surface groove, said molding portion is smaller than the substrate;
    disposing the mold adjacent the substrate with the molding surface adjacent the moldable surface;
    contacting the molding surface with the moldable surface at a contact interface so that said molding portion is positioned laterally within the periphery of the substrate;
    withdrawing fluid from a contacted area of the molding surface and the moldable surface through said surface groove and through the void;
    after or during the withdrawing of the fluid, pressing the mold and the substrate together by direct fluid pressure to imprint the moldable surface with said molding portion;
    after or during the pressing, hardening at least portion of the moldable surface imprinted by said molding portion; and
    applying pressurized fluid through said closed loop surface groove to facilitate separation of the mold from the imprinted moldable surface.

11. The method of claim 10 wherein said molding portion comprises at least one feature with a lateral dimension ranging from 1 nanometer to 10 micrometers.

12. The method of claim 10 wherein the step of said withdrawing overlaps with the step of said pressing in a time domain.

13. The method of claim 10 wherein the step of said withdrawing begins prior to or substantially simultaneously with the step of said pressing.

14. The method of claim 10 wherein said withdrawing effectuates to seal the contact interface about the closed loop surface groove between said molding portion and the moldable surface for said pressing by direct fluid pressure.

15. The method of claim 10 further comprising a step of separating the mold from the imprinted moldable surface by moving the mold and the substrate apart.

16. The method of claim 15 wherein the step of separating is facilitated by producing an initial separation gap around the periphery of said closed loop surface grooves by the step of applying pressurized fluid and by an entry of exterior fluid into said separation gap of the initial separation.

17. A method of imprint lithography to imprint a molding surface of a mold onto a moldable surface of a substrate comprising the steps of:
    providing the mold having a molding portion enclosed by a closed loop surface groove on the molding surface and a void fluidly coupled to the surface groove for conducting the fluid with the closed loop surface groove, said molding portion being smaller than the substrate;
    disposing the mold adjacent the substrate with the molding surface adjacent the moldable surface;
    contacting the molding surface with the moldable surface so that said molding portion is laterally in the periphery of the substrate;
    withdrawing fluid from the contacted area of the molding surface and the moldable surface through said closed loop surface groove and through the void;
    after or during the withdrawing of the fluid, pressing the mold and the substrate together by direct fluid pressure to imprint the moldable surface with said molding portion;
    after or during the pressing, hardening at least portion of the moldable surface imprinted by said molding portion;

applying pressurized fluid through said closed loop surface groove to facilitate separation of the mold from the imprinted moldable surface; and separating the mold from the imprinted moldable surface by producing an initial separation gap around the periphery of said closed loop surface groove by the step of applying pressurized fluid and by entry of exterior fluid into said separation gap.

18. The method of claim 17 wherein said step of withdrawing fluid seals the contact interface about the closed loop surface groove between said molding portion and the moldable surface for said pressing by direct fluid pressure.

19. The method of claim 17 wherein the step of separating the mold from the imprinted moldable surface is by the applying of the pressurized fluid first through the closed loop surface groove to first separate the mold from the substrate in a region of the closed loop surface groove and then applying the exterior fluid into the separation gap including the molding portion to then complete the separation of the mold from the substrate.

20. The method of claim 17 wherein the step of separating includes applying vacuum to vacuum attachment regions below the substrate to retain the substrate during the applying the pressurized fluid to the surface grooves.

* * * * *